(12) United States Patent
Nakata et al.

(10) Patent No.: US 7,592,647 B2
(45) Date of Patent: Sep. 22, 2009

(54) SEMICONDUCTOR DEVICE AND MANUFACTURING METHOD THEREOF

(75) Inventors: Ken Nakata, Nakakoma-gun (JP); Takeshi Kawasaki, Nakakoma-gun (JP); Seiji Yaegashi, Nakakoma-gun (JP)

(73) Assignee: Eudyna Devices Inc., Yamanashi (JP)

( * ) Notice: Subject to any disclaimer, the term of this patent is extended or adjusted under 35 U.S.C. 154(b) by 249 days.

(21) Appl. No.: 11/392,639

(22) Filed: Mar. 30, 2006

(65) Prior Publication Data

US 2006/0220060 A1   Oct. 5, 2006

(30) Foreign Application Priority Data

Mar. 31, 2005   (JP) ............................. 2005-104984

(51) Int. Cl.
*H01L 29/38* (2006.01)
*H01L 31/0328* (2006.01)
*H01L 31/0336* (2006.01)
*H01L 31/072* (2006.01)
*H01L 31/109* (2006.01)

(52) U.S. Cl. ....................... 257/194; 257/192; 257/330; 257/E29.253

(58) Field of Classification Search ................. 257/103, 257/192, 194, 330, E29.253
See application file for complete search history.

(56) References Cited

U.S. PATENT DOCUMENTS

| 5,406,094 A | * | 4/1995 | Arimoto et al. | ................ 257/24 |
| 6,897,495 B2 | * | 5/2005 | Yoshida et al. | .............. 257/192 |
| 2003/0089930 A1 | * | 5/2003 | Zhao | .......................... 257/256 |
| 2006/0118824 A1 | * | 6/2006 | Otsuka et al. | ................ 257/194 |

FOREIGN PATENT DOCUMENTS

| JP | 2003-051508 A | 2/2003 |
| JP | 2003-163354 A | 6/2003 |
| WO | WO 2005024955 A1 | * 3/2005 |

* cited by examiner

*Primary Examiner*—Howard Weiss
*Assistant Examiner*—Tifney L Skyles
(74) *Attorney, Agent, or Firm*—Westerman, Hattori, Daniels & Adrian, LLP.

(57) ABSTRACT

A semiconductor device includes a GaN-based semiconductor layer that is formed on a substrate and an opening region, an electron conduction layer formed on an inner surface of the opening region, an electron supply layer that has a larger band gap than the electron conduction layer and is formed on the electron conduction layer disposed on the inner surface of the opening region, and a gate electrode formed on a side surface of the electron supply layer in the opening region. A source electrode is formed on the GaN-based semiconductor layer. A drain electrode is connected to a surface of the GaN-based semiconductor layer opposite to the source electrode.

8 Claims, 8 Drawing Sheets

SEMICONDUCTOR DEVICE AND MANUFACTURING METHOD THEREOF

BACKGROUND OF THE INVENTION

1. Field of the Invention

The present invention relates to semiconductor devices and manufacturing methods thereof. More particularly, the present invention relates to a power control transistor that has a vertical structure and a manufacturing method thereof.

2. Description of the Related Art

A power control transistor is used in a wide range of fields, such as household electrical appliances, railways, electric automobiles, and electric power. The power control transistor is required to have a high breakdown capability such that dielectric breakdown does not occur even when high power is applied. In addition, low on-state resistance is required to actualize low energy loss. Thus, in recent years, transistors that have a vertical structure are gaining attention as power control transistors.

In particular, a vertical transistor that has a GaN (gallium nitride)-based semiconductor layer is drawing attention because the GaN-based semiconductor has a high breakdown capability and a high mobility. The GaN-based semiconductor is a single crystal or a mixed crystal that includes, for example, at least one of GaN, aluminum nitride (AlN), and indium nitride (InN). Japanese Patent Application Publication No. 2003-51508 discloses a vertical FET that has the following GaN-based semiconductor layers (hereinafter referred to as first related art). A GaN-based semiconductor layer (cap layer) with a large bandgap is formed on a side surface of a GaN-based semiconductor layer (channel layer) having no impurities added. A gate electrode is formed on a side surface of the cap layer. The top and bottom of the channel layer are connected to a source electrode and a drain, respectively. The gate electrode controls the electrons that flow through the interface between the channel layer and the cap layer. Japanese Patent Application Publication No. 2003-163354 discloses another vertical FET that has a GaN-based semiconductor layer with the cap layer serving as an insulating film (hereinafter referred to as second related art).

SUMMARY OF THE INVENTION

However, the vertical FETs disclosed in the first and second related arts do not have a good pinchoff characteristic. In addition, the mobility of the channel layer is low, and therefore, the on-state resistance is high. Thus, satisfactory electrical characteristics cannot be attained.

An object of the present invention is to provide a semiconductor with favorable electrical characteristics in which the pinchoff characteristics are improved and the mobility of the channel layer is enhanced, and a manufacturing method thereof.

According to an aspect of the present invention, there is provided a semiconductor device including: a GaN-based semiconductor layer that is formed on a substrate and has an opening region; an electron conduction layer formed on an inner surface of the opening region; an electron supply layer that has a larger band gap than the electron conduction layer and is formed on the electron conduction layer disposed on the inner surface of the opening region; a source electrode formed on the GaN-based semiconductor layer; and a drain electrode formed on a back surface of the substrate. In accordance with the present invention, the mobility of a two dimensional electron gas (2DEG) in the electron conduction layer is enhanced by regrowths of the electron conduction layer and the electron supply layer, and thus, a semiconductor device with favorable electrical characteristics can be provided.

The semiconductor device may be configured so that: the GaN-based semiconductor layer includes a P-type GaN-based semiconductor layer; at least the P-type GaN-based semiconductor layer is removed in the opening region; and the electron conduction layer formed on the P-type GaN-based semiconductor layer exposed in an inner surface of the opening region. With this structure, the pinch-off characteristics can be improved by the provision of the P-type semiconductor layer, and thus, a semiconductor device with favorable electrical characteristics can be provided.

The semiconductor device may be configured so that the GaN-based semiconductor layer includes a first N-type GaN-based semiconductor layer and a second N-type GaN-based semiconductor layer with the P-type GaN-based semiconductor layer being interposed therebetween. The P-type GaN-based semiconductor layer may be at least either a GaN layer or an AlGaN layer. The electron conduction layer may be an $In_{x2}Al_{y2}Ga_{(1-x2-y2)}N$ layer, and the electron supply layer may be an $In_{x1}Al_{y1}Ga_{(1-x1-y1)}N$ layer, and relationships ($0 \leq x2, y2, x1, y1 \leq 1$) and $2.81(y1-y2)-1.50(x1-x2)>0$ being satisfied. The electron conduction layer may be made of either GaN or InGaN and the electron supply layer is made of an AlGaN. The semiconductor device may further include an AlN layer between the electron conduction layer and the electron supply layer. The semiconductor device may be configured so that the electron conduction layer has a film thickness of 5 to 100 nm, and the substrate may be a silicon carbide (SiC) substrate, a sapphire substrate, a silicon substrate or a substrate including GaN.

According to another aspect of the present invention, there is provided a manufacturing method of a semiconductor device including: forming a GaN-based semiconductor layer on a substrate; forming an opening region on the GaN-based semiconductor layer; forming an electron conduction layer and an electron supply layer on a side surface of the GaN-based semiconductor layer in the opening region in this order; forming a gate electrode on a side surface of the electron supply layer in the opening region; forming a source electrode on the GaN-based semiconductor layer; and forming a drain electrode formed on a back surface of the substrate. In accordance with the present invention, the mobility of the 2DEG in the electron conduction layer is enhanced by regrowths of the electron conduction layer and the electron supply layer, and thus, a manufacturing method of a semiconductor device with favorable electrical characteristics can be provided.

The step of forming the GaN-based semiconductor layer may include a step of forming a P-type GaN-based semiconductor layer, and the step of forming the opening region may include a step of removing the P-type GaN-based semiconductor layer. In accordance with the present invention, the pinch-off characteristics can be improved by the provision of the P-type semiconductor layer, and thus, a manufacturing method of a semiconductor device with favorable electrical characteristics can be provided.

The step of forming the GaN-based semiconductor layer may include a step of forming a first N-type GaN-based semiconductor layer and a step of forming a second N-type semiconductor layer before and after the step of forming the P-type GaN-based semiconductor layer. The step of forming the GaN-based semiconductor layer may use a metal organic chemical vapor deposition (MOCVD) method or a molecular beam epitaxy (MBE) method to form a film.

In accordance with the present invention, the pinch-off characteristics can be improved, the mobility of the electron conduction layer can be enhanced, and thus, the provision of a semiconductor device that is a vertical FET having favorable electrical characteristics and a manufacturing method thereof can be actualized.

DESCRIPTION OF THE PREFERRED EMBODIMENTS

Figure 1:
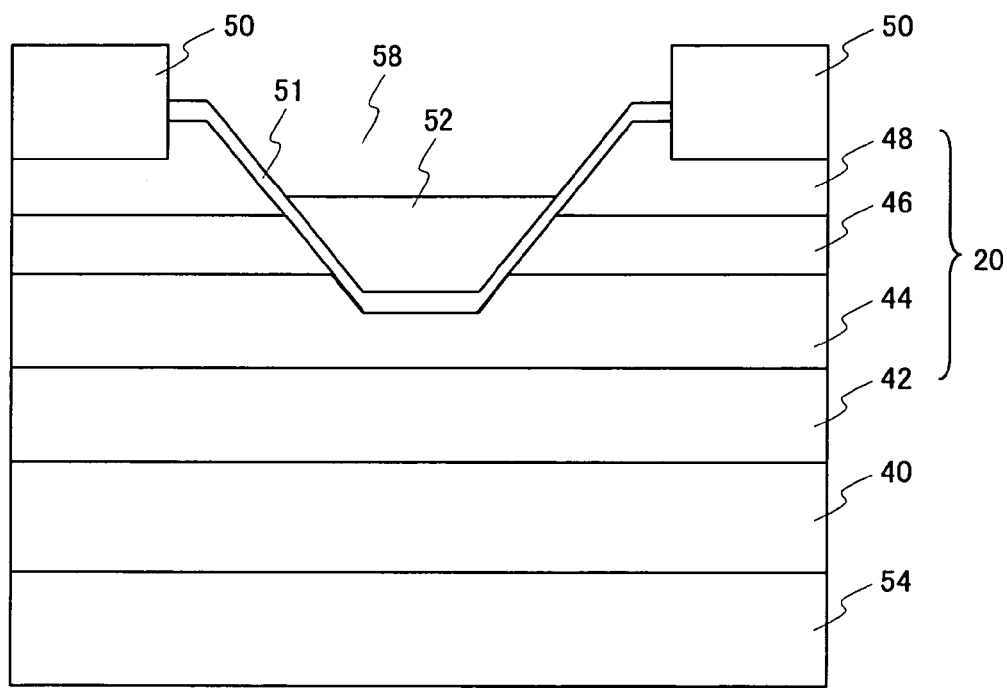
FIG. 1 is a cross-sectional view of first related art.

In order to facilitate better understanding of the present invention, a description will now be given of the factors causing poor pinch-off characteristics and channel layer mobility in the related art. First, the structure of a conventional vertical FET will be explained briefly, with reference to FIG. 1. An N-type buffer layer 42, an N-type drift layer 44, a channel layer 46 that is a P-type or to which no impurities have been added, and an N-type source layer 48 are formed on a substrate 40 in this order, as a GaN-based semiconductor layer 20. An opening region 58 that reaches the drift layer 44 is provided, and a cap layer 51 is formed to cover the opening region 58. A source electrode 50 is formed on the source layer 48, a gate electrode 52 is formed on the opening region 58, and a drain electrode 54 is formed on the back surface of the substrate 40.

In the conventional vertical FET mentioned above, electrons flow through the interface between the channel layer 46 and the cap layer 51 from the source electrode 50, and flows in a vertical direction towards the drain electrode 54. In the first related art mentioned above impurities are not added to the channel layer 46. Thus, when high voltage is applied between the source electrode 50 and the drain electrode 54, the electrons flow through the channel layer 46 that is deeper than the interface between the channel layer 46 and the cap layer 51, and thus, the pinch-off characteristics are degraded.

Figure 2:
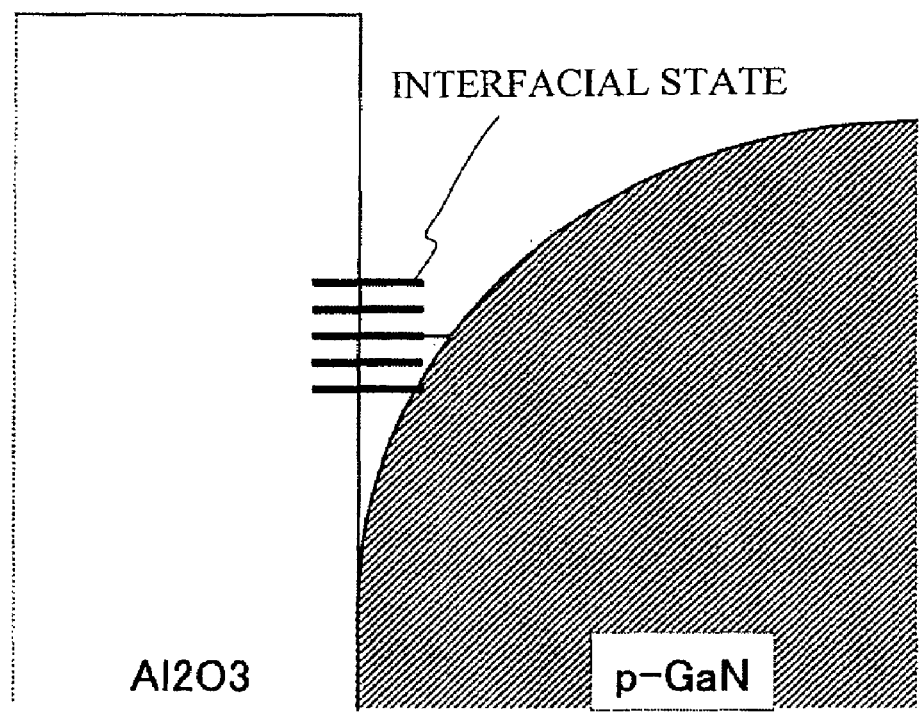
FIG. 2 is a view of bands near the cap layer and the channel layer of second related art.

In the second related art, the pinch-off characteristics are improved, as explained below. FIG. 2 is a diagram of bands near the interface between an aluminum oxide layer that serves as the cap layer 51 and a P-type GaN layer that serves as the channel layer 46. The shaded area indicates the P-type area. The band is raised due to P-type impurities in the channel layer 46. Therefore, the electrons flow through the interface between the channel layer 46 and the cap layer 51, even when a high voltage is applied between the source electrode 50 and the drain electrode 54. Thus, the pinch-off characteristics can be improved.

However, the channel layer mobility is reduced in the second related art. Generally, magnesium (Mg) is used as the P-type impurity in the GaN-based semiconductor layer. However, the activation rate of Mg in the GaN-based semiconductor layer is an extremely low level of several percent. Therefore, to attain a P-type carrier concentration of $1 \times 10^{17}$ cm$^{-3}$, about $1 \times 10^{19}$ cm$^{-3}$ of Mg must be added. As a result, the electrons are scattered due to the large amount of Mg in the channel layer 46, and the mobility is reduced. Thus, the on-state resistance increases.

Furthermore, in the first and second related arts, the density of the interfacial state between the cap layer 51 and the channel layer 46 is high, thereby reducing the mobility of the channel layer 46. The factor causing the high density of the interfacial state is as follows. When a nitride semiconductor (GaN-based semiconductor) layer is used as the cap layer 51, the growth temperature of the nitride semiconductor (GaN-based semiconductor) layer is high and the removal temperature of nitrogen is high. Therefore, nitrogen evaporates away from the channel layer 46 during the rise in the temperature before growth, and crystal defect increases within the channel layer 46. When the cap layer 51 is used as an insulating film layer, a high-quality insulating film layer such as Si device is not formed on the channel layer 46 that is the GaN-based semiconductor layer. Regardless of the nitride semiconductor (GaN-based semiconductor) layer or an insulating film being used as the cap layer 51 as such, the density of the interfacial state between the cap layer 51 and the channel layer 46 is high and the mobility of the channel layer 46 is reduced. Thus, the on-state resistance increases. The following embodiments of the present invention are capable of resolving the above issues.

First Embodiment

Figure 3:
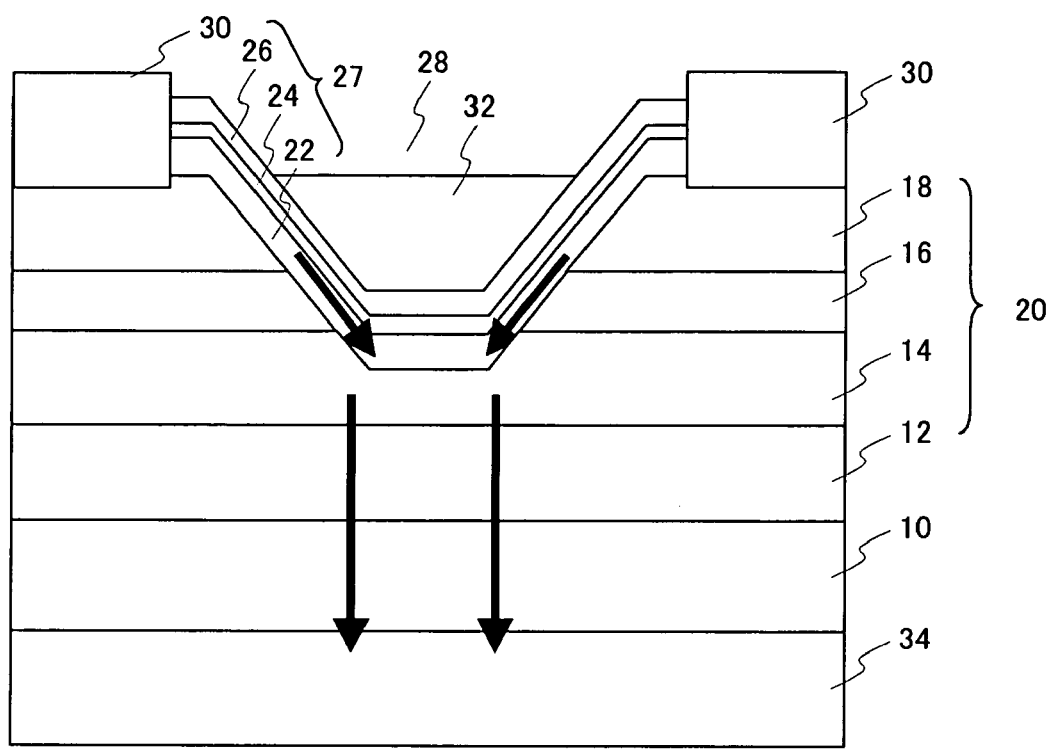
FIG. 3 is a cross-sectional view of a first embodiment.

FIG. 3 is a cross-sectional view of a first embodiment. An N-type AlGaN buffer layer 12, an N-type GaN drift layer 14 (a first N-type GaN-based semiconductor layer), a P-type GaN or AlGaN barrier layer 16 (P-type GaN-based semiconductor layer) and an N-type GaN cap layer 18 (a second N-type GaN-based semiconductor layer) are formed on a conductive SiC substrate 10 in this order, as the GaN-based semiconductor layer 20. In other words, the GaN-based semiconductor layer 20 includes a P-type GaN-based semiconductor layer, and a first GaN-based semiconductor layer and a second semiconductor layer between which the P-type GaN-based semiconductor layer is sandwiched.

An opening region 28 that reaches the drift layer 14 is formed on the GaN-based semiconductor layer 20. In other words, at least the barrier layer 16 (P-type GaN-based semiconductor layer) is removed in the opening region 28. A GaN electron conduction layer 22 to which no impurities are added, an AlN intermediate layer 24, and an AlGaN electron supply layer 26 having a larger bandgap than the electron conduction layer 22 are formed to cover the opening region 28, as a regrowth layer 27. A source electrode 30 is formed on the cap layer 18, a gate electrode 32 is formed within the opening region 28, and a drain electrode 34 is formed on the back surface of the substrate 10. In other words, the electron conduction layer 22 is formed on the side surface of the GaN-based semiconductor layer 20 in the opening region 28, and the electron supply layer 26 is formed on the electron conduction layer 22. The drain electrode 34 is formed on the back surface of the substrate.

Figure 4:
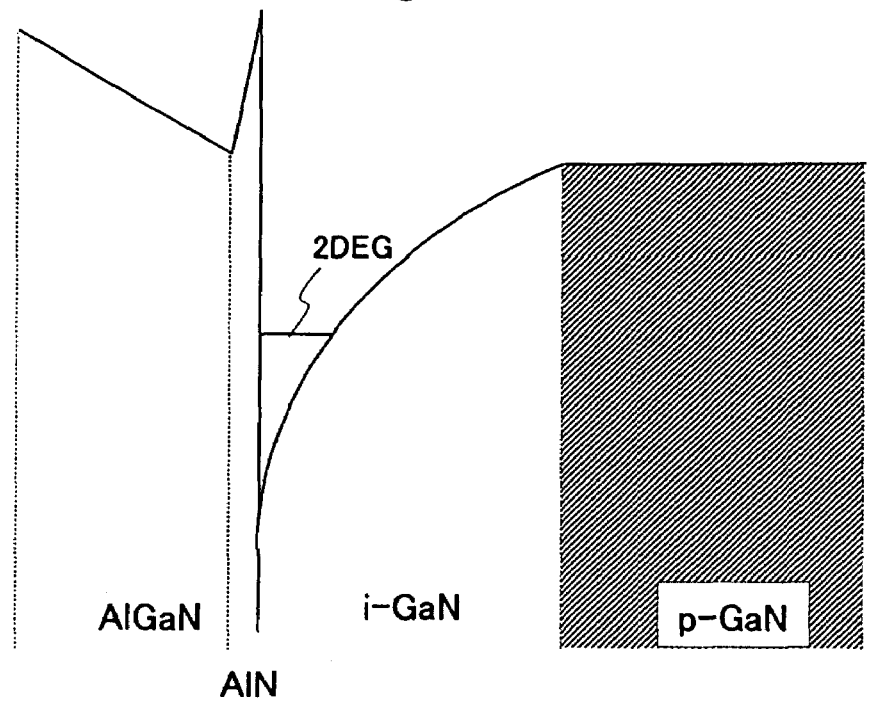
FIG. 4 is a view of bands near an electron supply layer, an electron conduction layer, and a barrier layer in the first embodiment.
Figure 5:
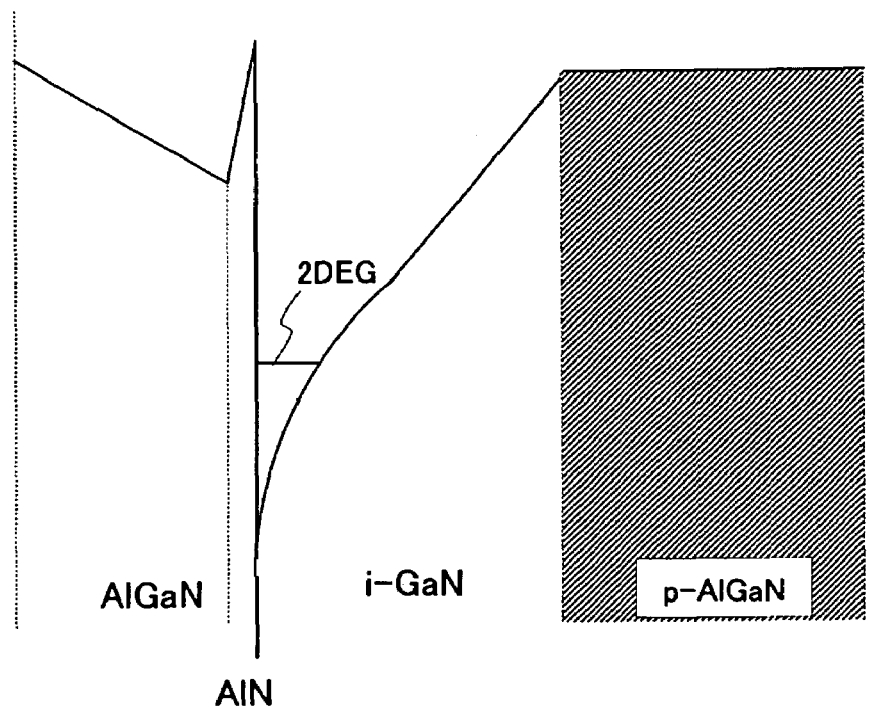
FIG. 5 is another view of bands near an electron supply layer, an electron conduction layer, and a barrier layer in the first embodiment.
Figure 6:
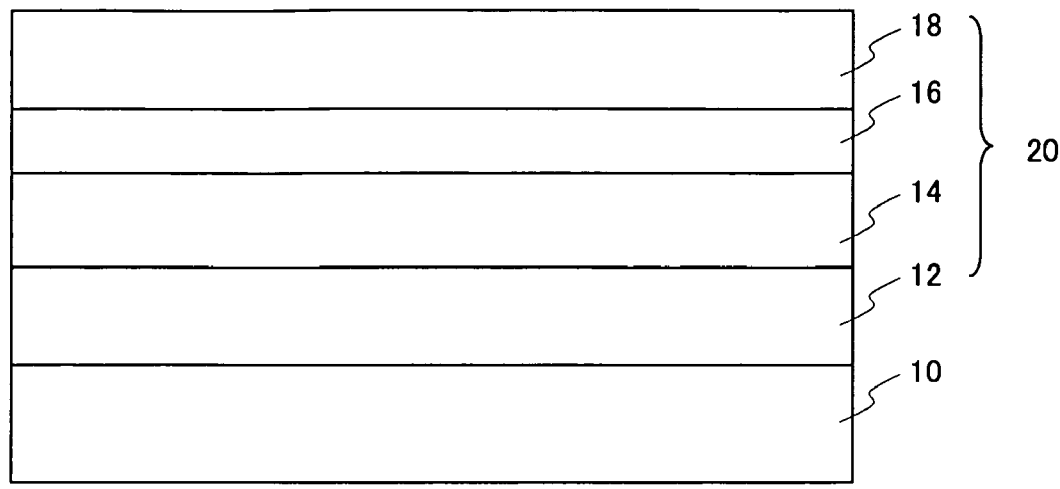
FIG. 6 is a cross-sectional view of a manufacturing process of the first embodiment.

In the first embodiment, the electrons flow from the source electrode 30 through the electron conduction layer 22, and then flow from the drift layer 14 to the drain electrode 34 vertically, as shown by the arrow in FIG. 3. FIG. 4 and FIG. 5 are diagrams of bands near the barrier layer 16. The diagrams are of the AlGaN electron supply layer 26, the AlN intermediate layer 24, the GaN electron conduction layer 22, and the band of the P-type GaN (FIG. 4) or the AlGaN (FIG. 5) barrier layer. Two-dimensional electron gas (2DEG) for a passage of electrons is generated in the interface between the undoped GaN channel layer 22 and the intermediate layer 24. The consecutive growth of the electron conduction layer 22, the intermediate layer 24 and the electron supply layer 26 does not cause any interfacial state at the interface between the insulating film and the channel layer and also due to the desorption of nitrogen such as that which occurs in the first related art. This differs from the first and second prior arts. Therefore, the 2DEG has a high mobility. Furthermore, the use of the P-type barrier layer does not cause electrons to flow through a deep 2DEG, and does not degrade the pinch-off characteristics. This is different from the first related art.

In the first embodiment, the pinch-off characteristics can be improved by providing the P-type barrier layer 16, and the 2DEG mobility of the electron conduction layer 22 can be enhanced by the regrowth of the electron conduction layer 22 and the electron supply layer 26, as such. Thus, a vertical FET with favorable electrical characteristics can be actualized. Here, the barrier layer can be a P-type GaN barrier layer as in FIG. 4. As shown in FIG. 5, the band potential can be raised through the use of the P-AlGaN layer as the barrier layer, then the pinch-off characteristics can be further improved.

In addition, resistance other than the channel resistance can be reduced and the on-state resistance can be reduced because the N-type GaN layers are placed on both sides of the P-type barrier layer 16.

In order to verify the effects of the first embodiment, the on-state resistance of a vertical FET, which has different regrowth layers 27 grown in the opening region 28, was evaluated. When the regrowth layer is only an AlGaN layer with a film thickness of 30 nm, the on-state resistance of the vertical FET is 40 mΩ·cm². On the other hand, if an AlGaN electron supply layer with a film thickness of 30 nm is regrown in a GaN electron conduction layer with a film thickness of 10 nm, 30 nm, and 50 nm, the on-state resistance is 20 mΩ·cm², 10 mΩ·cm², and 4 mΩ·cm², respectively.

Through the regrowth of the electron conduction layer 22 and the electron supply layer 26 in the opening region 28 as such, the 2DEG mobility can be enhanced and the on-state resistance can be improved. If the film thickness of the electron conduction layer 22 is thinner than 5 nm, the 2DEG mobility is reduced because the 2DEG and the regrowth interface are close to each other, and the on-state resistance increases. In addition, if the film thickness of the electron conduction layer 22 is thicker than 100 nm, the effect of the P-type barrier weakens and the pinch-off characteristics are degraded. Thus, the film thickness of the electron conduction layer 22 is preferably 5 nm to 100 nm.

Furthermore, the on-state resistance becomes 4 mΩ·cm² when the AlN intermediate layer 26 with a film thickness of 2 nm being inserted between the electron supply layer 26 and the electron conduction layer 22, when the film thickness of the GaN electron conduction layer is 50 nm. Therefore, although the AlN intermediate layer 24 is not essential for the present invention, the scattering of the electrons in the interface between the electron conduction layer 22 and the electron supply layer 26 can be controlled by the insertion thereof, and mobility can be further enhanced. Thus, the on-state resistance can be improved. In addition, although impurities do not have to be added to the electron supply layer 26, the electron density of the 2DEG can be improved and the on-state resistance can be further reduced by the addition of Si of about $1.0 \times 10^{18}$ cm$^{-3}$.

Furthermore, a high mobility can be attained by the use of a single crystal or a mixed crystal composed of, for example, at least one of GaN, AlGaN, or InGaN as the GaN-based semiconductor in the electron conduction layer 22 and the electron supply layer 26. In particular, a high mobility can be attained if GaN or InGaN is used in the electron conduction layer 22 and AlGaN is used in the electron supply layer 26. Furthermore, a high mobility can be attained if the electron conduction layer is an $In_{x2}Al_{y2}Ga_{(1-x2-y2)}N$ layer, the electron supply layer is an $In_{x1}Al_{y1}Ga_{(1-x1-y1)}N$ layer, and relationships ($0 \leq x2$, y2, x1, $y1 \leq 1$) and $2.81(y1-y2)-1.50(x1-x2)>0$ relationship are satisfied.

In this case, it can be stated that the bandgap of $In_xAl_yGa_{(1-x-y)}N$ is $Eg(X,Y)=1.89x+6.2y+3.39(1-x-y)$. Therefore, the condition under which the bandgap of the electron supply layer 26 is larger than that of the electron conduction layer is $Eg(x1,y1)>Eg(x2,y2)$. From $1.89x1+6.2y1+3.39(1-x1-y1)>1.89x2+6.2y2+3.39(1-x2-y2)$, $2.81(y1-y2)-1.5(x1-x2)>0$. Here, x=0 indicates a situation where AlGaN that does not contain InGaN is used, y=0 indicates a situation where InGaN that does not contain AlN is used, and x=y=0 indicates a situation where GaN is used.

Although the drain electrode 34 is formed on the back surface of the substrate 10, this is irrelevant as long as the drain electrode 34 is connected to the surface of the drift layer 14 that opposes the source electrode 30. For example, an N-type SiC contact layer can be provided between the drift layer 14 and the substrate 10, and the drain electrode that is connected to the contact surface from the front surface can be formed. When the drain electrode 34 is formed on the back surface of the substrate 10, for example, a conductive substrate composed of SiC, Si, or GaN-based semiconductor can be used as the substrate 10. When the drain electrode is formed from the front surface, the substrate does not have to be conductive, and for example, a SiC, Si or GaN-based semiconductor substrate, a silicon substrate or a sapphire substrate can be used. Through the use of these materials, a GaN-based semiconductor layer with high crystallizability can be formed.

Next, a manufacturing method of the first embodiment is explained using FIG. 6 to FIG. 11. First, referring to FIG. 6, the N-type AlGaN buffer layer 12, the N-type GaN drift layer 14 (a first N-type GaN-based semiconductor layer), the P-type GaN or AlGaN barrier layer 16 (P-type GaN-based semiconductor layer) and the N-type GaN cap layer 18 (a second N-type GaN-based semiconductor layer) are formed on the conductive SiC substrate 10 in this order, as the GaN-based semiconductor layer 20. These layers are formed using, for example, a metal organic chemical vapor deposition (MOCVD) method at a growth temperature of 1050° C. A molecular beam epitaxy (MBE) method can be used in place of the MOCDV method, as well. In this way, a GaN-based semiconductor layer with high crystallizability can be formed. In addition, the film thickness of each layer is 0.5 μm, 4.0 μm, 0.5 μm, and 0.3 μm, respectively. Furthermore, the carrier concentration of each layer is $1.0 \times 10^{17}$ cm$^{-3}$, $1.0 \times 10^{16}$ cm$^{-3}$, $5.0 \times 10^{16}$ cm$^{-3}$ and $5.0 \times 10^{17}$ cm$^{-3}$, respectively. The AlN composition ratios of the barrier layer 12 and the barrier layer 16 are 0.06 and 0.09, respectively.

Figure 7:
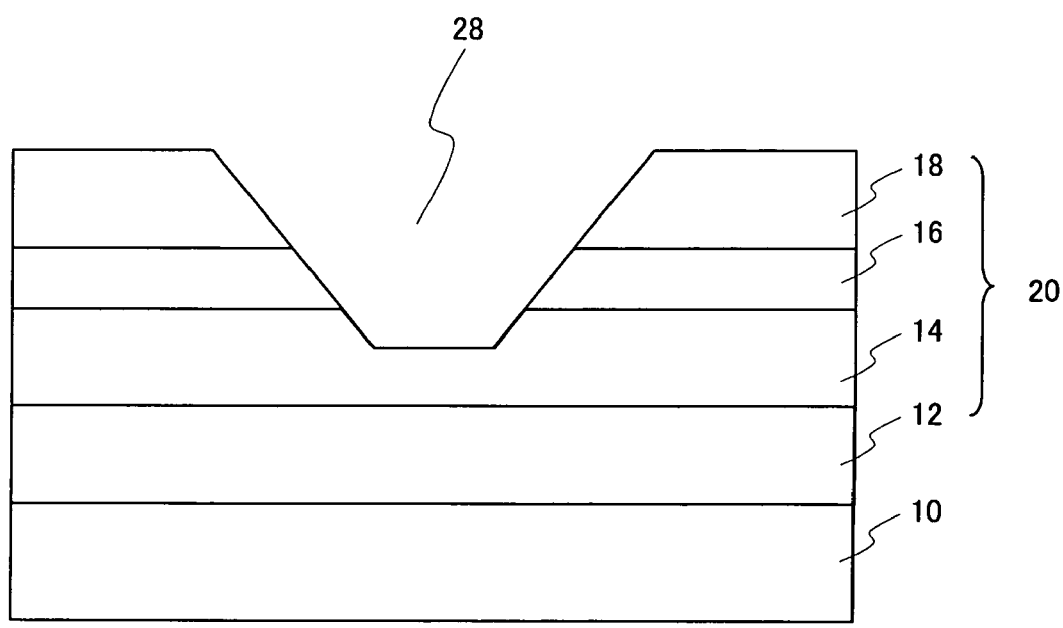
FIG. 7 is a cross-sectional view of a manufacturing process that follows the process shown in FIG. 6.

Next, referring to FIG. 7, a silicon oxide film is formed to 200 nm on the cap layer 18 by sputtering. Subsequently, photoresist is formed in a predetermined area using an ordinary exposure technique. The silicon oxide film on the predetermined area is removed by wet-etching using buffered fluoric acid. Then, the resist on the silicon oxide film is removed by ashing using oxygen. Portions of the cap layer 18, the barrier layer 16, and the drift layer 14 are etched by a reactive ion etching (RIE) method using chloride gas with the silicon oxide film as a mask, and the opening region 28 is formed. At this time, portions of the cap layer 18, the barrier layer 16, and the drift layer 14 are exposed in the side surface of the opening region 28. The side surface of the opening region 28 is a slanted surface at about a 60° angle to the surface of the substrate. The angle of the slanted surface to the substrate surface can be controlled by the flow rate of gas-pressure of the chloride gas used in the RIE method and that of other gases. The silicon oxide film used as the mask is removed, for example, by wet-etching using buffered fluoric acid. Furthermore, in order to clean the crystal surface of the GaN-based semiconductor layer 20 on the side surface of the opening region 28, cleaning by aqueous ammonium fluoride ($NH_4F$) solution and cleaning by aqueous hydrochloric acid solution are performed continuously.

Figure 8:
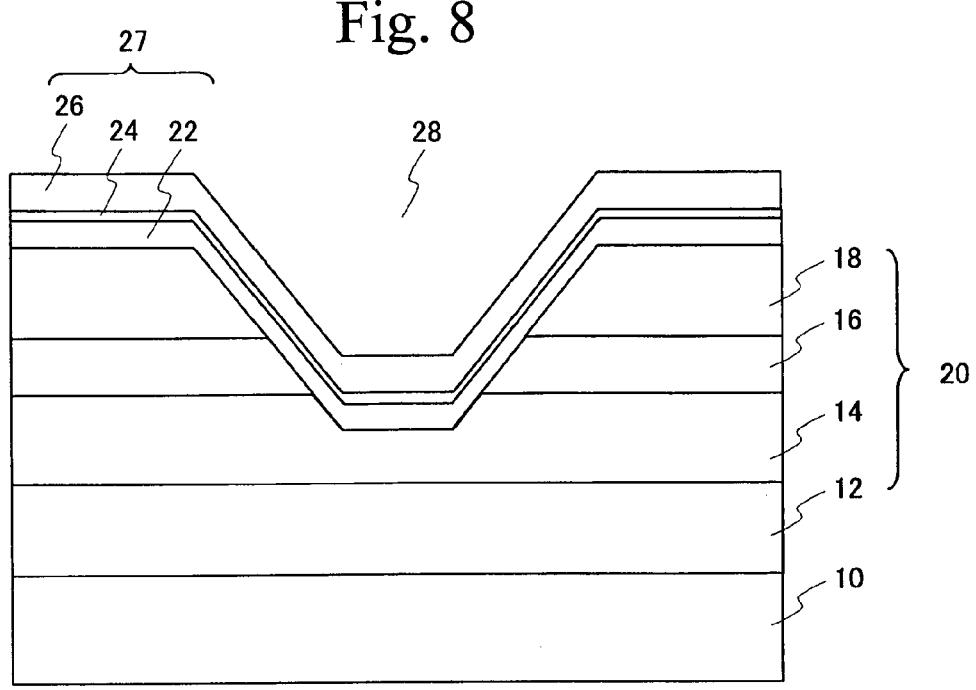
FIG. 8 is a cross-sectional view of a manufacturing process that follows the process shown in FIG. 7.

Referring to FIG. 8, the GaN conduction layer 22 of 50 nm, to which no impurities have been added, is formed by MOCVD at a growth temperature of 1020° C., as the regrowth layer 27. Then, the regrowth temperature is raised to 1080° C., the AlN intermediate layer 24 is formed to 2 nm, and the AlGaN electron supply layer 26 with an AlN composition ratio of 0.27, is formed to 30 nm. In other words, the electron conduction layer 22 and the electron supply layer 26 are formed on the side surface of the opening region 28. The regrowth is preferably formed at a lower temperature than the growth temperature of the GaN-based semiconductor layer and a high V/III ratio to prevent decrease in the growth rate on the side surface of the opening region 28. Furthermore, when raising the growth temperature from that during the formation of the electron conduction layer 22 to form the intermediate layer 24 and the electron supply layer 26, the temperature is preferably raised in a short period of time to reduce damage to the crystal surface. For example, the temperature preferably rises in less than 20 minutes. The MBE method can be used in place of the MOCDV method, as well.

Figure 9:
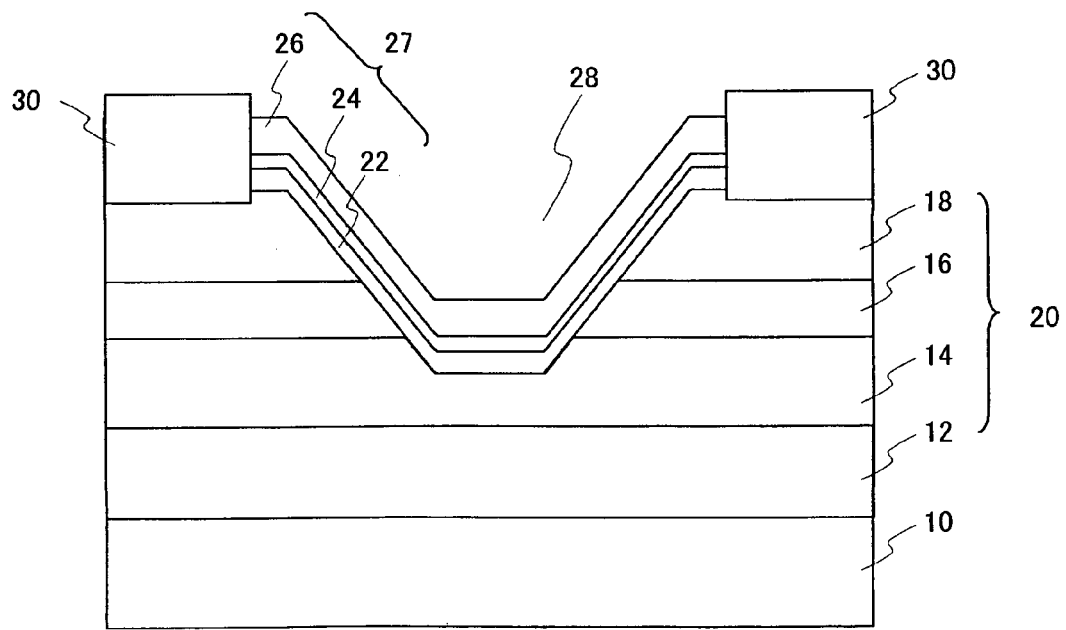
FIG. 9 is a cross-sectional view of a manufacturing process that follows the process shown in FIG. 8.

Referring to FIG. 9, the photoresist having an opening region is formed in the predetermined area using an ordinary exposure technique. Ti/Al is formed as the source electrode 30 on the flat surface of the cap layer 18, using a deposition method and a lift-off method. Heat treatment is performed for 30 seconds at a temperature of 800° C. in a nitrogen atmosphere. In this way, an alloy layer is formed on the interface between the Ti/Al and the cap layer 18. As a result, a favorable ohmic contact with an ohmic contact resistance of about 0.4 Ωmm is obtained. The source electrode 30 can be composed of metal other than Ti/Al, as long as ohmic contact is formed with the GaN-based semiconductor layer 20. In addition, the AlGaN electron supply layer 26 and the AlN intermediate layer 24 are preferably removed by etching through the RIE method using chloride gas, before Ti/Al is deposited as the source electrode 30. In this case, there is no electron barrier due to the intermediate layer 24, and the ohmic contact resistance can be reduced to 0.2 Ωmm.

Figure 10:
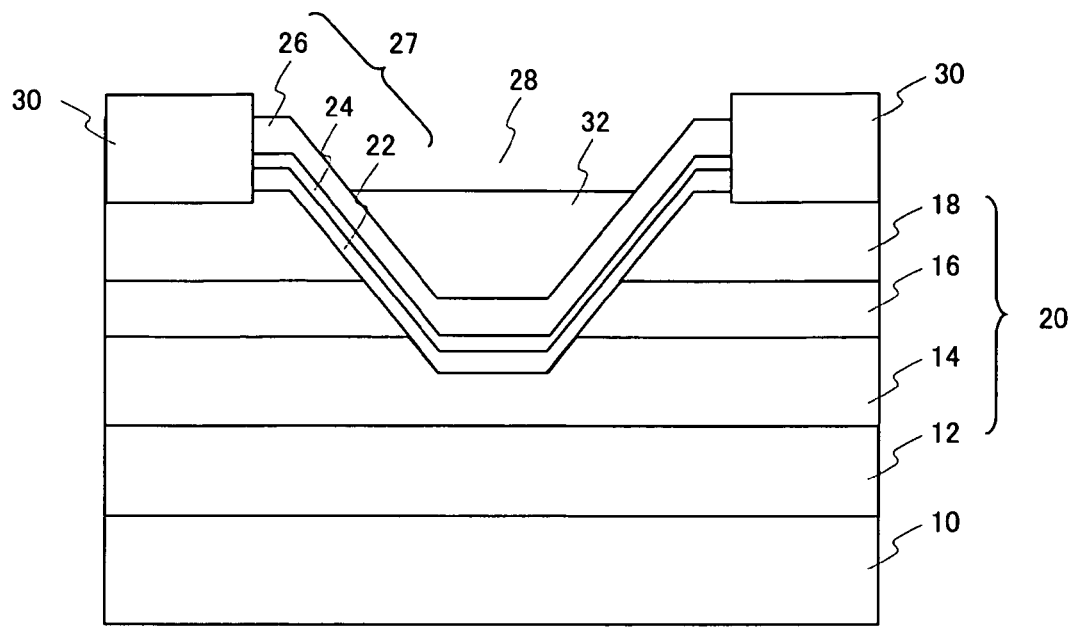
FIG. 10 is a cross-sectional view of a manufacturing process that follows the process shown in FIG. 9.

Referring to FIG. 10, a photoresist that has a predetermined opening region is formed using an ordinary exposure technique. Ni/Al is formed as the gate electrode 32 on the side surface of the opening region 28, using a deposition method and a lift-off method. In other words, the gate electrode 32 is formed on the opening region side surface of the electron supply layer 26. Other than Ni/Al, for example, metal that forms a Schottky junction with the GaN-based semiconductor, such as Pt/Au, Pd/Au and Mo/Au, can be used as the gate electrode 32.

For example, an insulating film (not shown) composed of a silicon oxide film can be formed with a film thickness of 10 nm to cover the side surface of the opening region 28, using the sputter method, before the gate electrode 32 is formed. Then, the gate electrode 32 is formed. In this way, a vertical FET having a metal insulator semiconductor field-effect transistor (MISFET) structure can be made. Other than the silicon oxide film, a silicon nitride film or an aluminum oxide film can be used as the insulating layer.

Interconnection layers (not shown) that connects with the gate electrode 32 and the source electrode 30 are formed. Next, for example, a silicon nitride film, a silicon oxide film, or a silicon oxynitride film is formed to cover the entire surface of the transistor as the insulating film layer (not shown) that protects the transistor surface. The insulating film layer of a bonding pad section (not shown) is removed using the RIE method. Thus, the manufacturing process of a wafer surface is completed.

Figure 11:
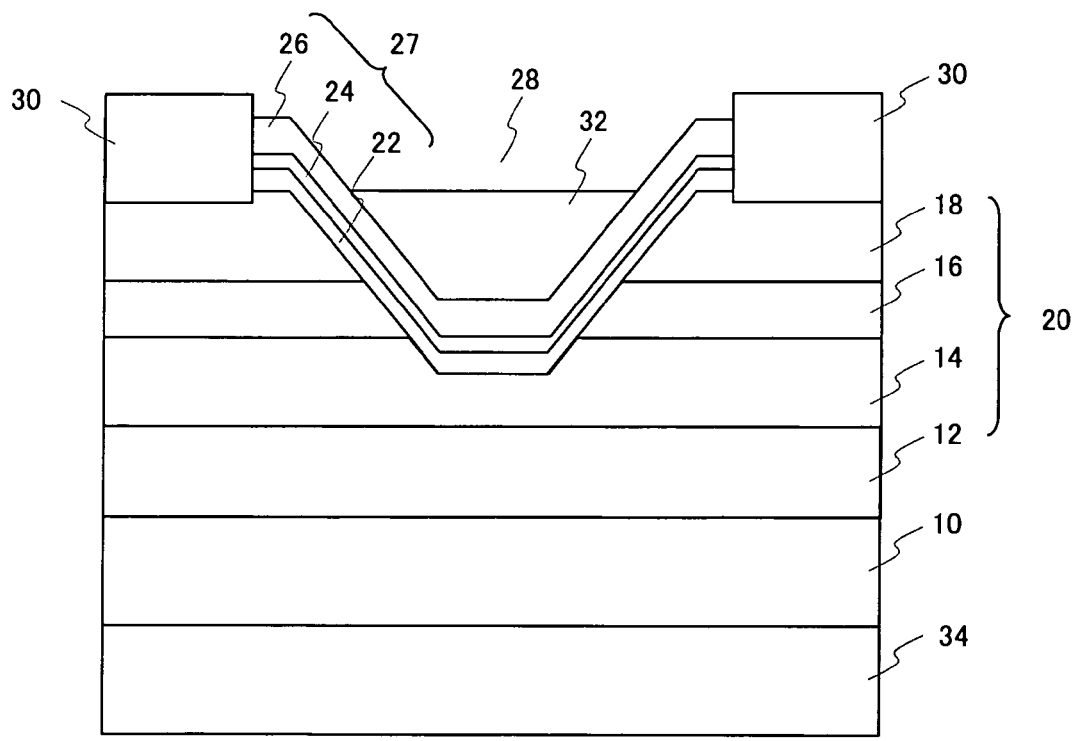
FIG. 11 is a cross-sectional view of a manufacturing process that follows the process shown in FIG. 10.

Referring to FIG. 11, the photoresist protects the wafer surface. The back surface of the SiC substrate 10 is ground by a grinding device until the substrate is 100 μm thick. The photoresist on the wafer surface is removed by oxygen-ashing. Heat treatment is performed for 30 seconds at a temperature of 850° C. In this way, the SiC substrate 10 and the drain metal 34 form an alloy, and the substrate 10 and the drain metal 34 form an ohmic contact. Thus, the vertical FET in accordance with the first embodiment is completed.

Figure 12:
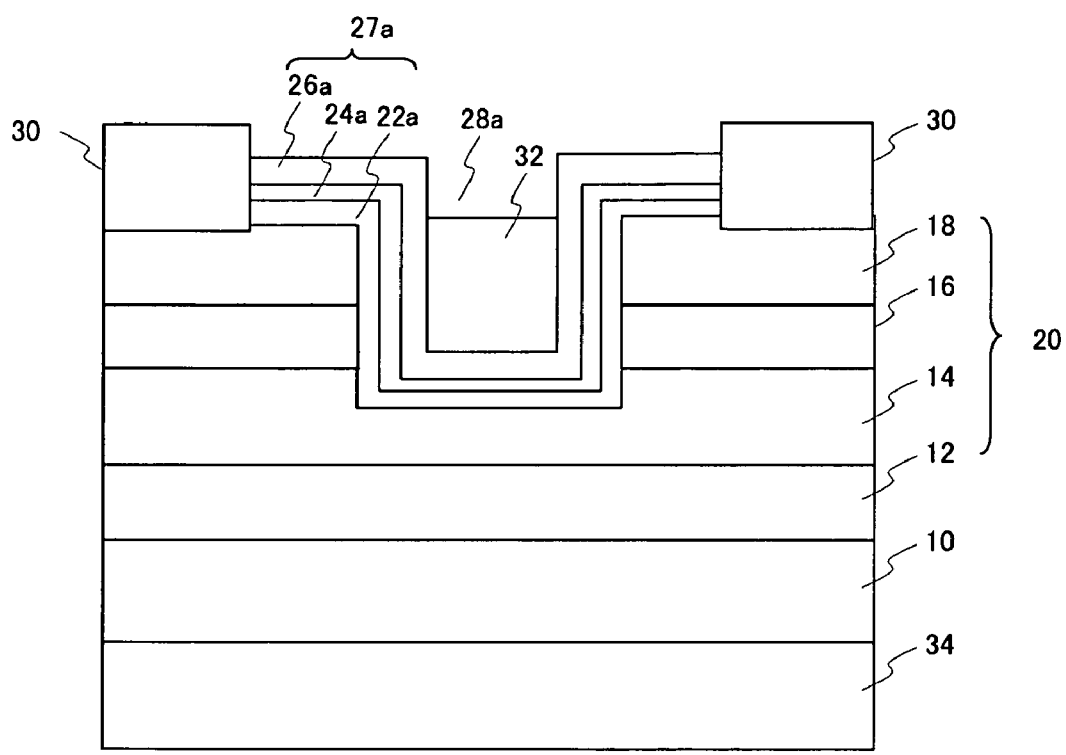
FIG. 12 is a cross-sectional view of a variation of the first embodiment.

A variation of the first embodiment will be explained. FIG. 12 is a cross-sectional view of the vertical FET in accordance with a variation of the first embodiment. The structure and the manufacturing method are the same as those of the first embodiment, aside from the angle of the side surface of an opening region 28a to the surface of the substrate 10 being almost perpendicular. The GaN-based semiconductor layer 20 is formed on the SiC substrate 10 with the same layer structure as that is the first embodiment. The opening region 28a that has a side surface that is almost perpendicular to the surface of the substrate 10 and that reaches the drift layer 14 is formed on the GaN-based semiconductor layer 20. The side surface of the opening region 28a that is almost perpendicular to the substrate 10 surface is formed by optimizing the flow rate of the gas-pressure of the chloride gas and the other gases used in the RIE method when the opening region 28a is formed. A GaN electron conduction layer 22a to which no impurities are added, an AlN intermediate layer 24a, an AlGaN electron supply layer 26a that has a larger bandgap than the electron conduction layer 22a are formed to cover the opening region 28a, as a regrowth layer 27a. The source electrode 30, the gate electrode 32, and the drain electrode 34 are formed as in the first embodiment.

What is claimed is:

1. A semiconductor device including:
   a GaN-based semiconductor layer that is formed on a substrate and has an opening region;
   an electron conduction layer formed on an inner surface of the opening region;
   an electron supply layer that has a larger band gap than the electron conduction layer and is formed on the electron conduction layer disposed on the inner surface of the opening region;
   a source electrode formed on the GaN-based semiconductor layer;
   a drain electrode formed on a back surface of the substrate; and an AlN layer between the electron conduction layer and the electron supply layer.

2. The semiconductor device as claimed in claim 1, wherein: the GaN-based semiconductor layer includes a P-type GaN-based semiconductor layer;
at least the P-type GaN-based semiconductor layer is removed in the opening region; and
the electron conduction layer formed on the P-type GaN-based semiconductor layer exposed in an inner surface of the opening region.

3. The semiconductor device as claimed in claim 2 wherein wherein the GaN-based semiconductor layer includes a first N-type GaN-based semiconductor layer and a second N-type GaN-based semiconductor layer with the P-type GaN-based semiconductor layer being interposed therebetween.

4. The semiconductor device as claimed in claim 2, wherein the P-type GaN-based semiconductor layer is at least either a GaN layer or an AlGaN layer.

5. The semiconductor device as claimed in claim 1, wherein:
the electron conduction layer is an $In_{x2}Al_{y2}Ga_{(1-x2-y2)}N$ layer;
the electron supply layer is an $In_{x1}Al_{y1}Ga_{(1-x1-y1)}N$ layer, and;
relationships ($0 \leq x2, y2, x1, y1 \leq 1$) and $2.81(y1-y2)-1.50(x1-x2) > 0$ are satisfied.

6. The semiconductor device as claimed in claim 1, wherein the electron conduction layer is made of either GaN or InGaN and the electron supply layer is made of an AlGaN.

7. The semiconductor device as claimed in claim 1, wherein the electron conduction layer has a film thickness of 5 to 100 nm.

8. The semiconductor device as claimed in claim 1, wherein the substrate is a silicon carbide (SiC) substrate, a sapphire substrate, a silicon substrate or a substrate including GaN.

* * * * *